(12) United States Patent
Mori et al.

(10) Patent No.: US 7,012,364 B2
(45) Date of Patent: Mar. 14, 2006

(54) ORGANIC ELECTROLUMINESCENT DISPLAY

(75) Inventors: Toshitaka Mori, Tokyo (JP); Yasuyuki Ohyagi, Tokyo (JP); Junji Kido, 12-16, Rinsenji 3-chome, Yonezawa-shi, Yamagata-ken (JP)

(73) Assignees: Dai Nippon Printing Co., Ltd., Tokyo (JP); Junji Kido, Yonezawa (JP)

( * ) Notice: Subject to any disclaimer, the term of this patent is extended or adjusted under 35 U.S.C. 154(b) by 0 days.

(21) Appl. No.: 10/673,179

(22) Filed: Sep. 30, 2003

(65) Prior Publication Data

US 2005/0127824 A1 Jun. 16, 2005

(30) Foreign Application Priority Data

| Oct. 1, 2002 | (JP) | ............................. 2002-288360 |
| Oct. 3, 2002 | (JP) | ............................. 2002-290828 |

(51) Int. Cl.
*H01J 1/62* (2006.01)
*H01J 63/04* (2006.01)

(52) U.S. Cl. ...................................... 313/504; 313/506
(58) Field of Classification Search ........ 313/498–512; 428/690
See application file for complete search history.

(56) References Cited

U.S. PATENT DOCUMENTS 4,720,432 A * 1/1988 VanSlyke et al. ........... 313/498
6,121,727 A * 9/2000 Kanai et al. ................. 313/504
6,391,482 B1 * 5/2002 Matsuo et al. ............... 313/504
6,501,217 B1 * 12/2002 Beierlein et al. ............ 313/504
6,821,649 B1 * 11/2004 Kambe et al. ............... 313/504
2002/0004146 A1 * 1/2002 Kido et al. .................. 313/504
2002/0021088 A1 * 2/2002 Howard et al. .............. 313/504
2003/0165715 A1 * 9/2003 Yoon et al. .................. 428/690
2005/0084713 A1 * 4/2005 Kido et al. .................. 428/690

FOREIGN PATENT DOCUMENTS

JP 2003068471 A * 3/2003

* cited by examiner

*Primary Examiner*—Joseph Williams
*Assistant Examiner*—Peter Macchiarolo
(74) *Attorney, Agent, or Firm*—Oblon, Spivak, McClelland, Maier & Neustadt, P.C.

(57) ABSTRACT

An organic electroluminescent image display apparatus capable of displaying a high-quality image wherein light is taken out from a cathode layer side of an upper surface is described. The organic electroluminescent image display apparatus includes an anode layer, an organic layer, a barrier conductive layer having optical transparency, and a cathode layer having the optical transparency successively disposed on a substrate. The barrier conductive layer contains a metal, an inorganic nitride, and/or an inorganic oxide. Alternatively, the organic electroluminescent image display apparatus includes an anode layer, an organic layer, a first cathode layer having optical transparency, an electron transport protective layer having the optical transparency, and a second cathode layer having the optical transparency successively disposed on a substrate. The electron transport protective layer contains an alkali metal and/or an alkali earth metal in an electron transporting organic material.

12 Claims, 1 Drawing Sheet

ORGANIC ELECTROLUMINESCENT DISPLAY

BACKGROUND OF THE INVENTION

The present invention relates to an organic electroluminescent image display apparatus, especially to an organic electroluminescent image display apparatus in which light can be taken out on a cathode layer side of an upper surface.

An organic electroluminescent (EL) device has advantages that visibility is high by self color development, an all-solid display superior in impact resistance is provided different from a liquid crystal display, a speed of response is high, little influence of a temperature change is exerted, and a visual field angle is large. In recent years, use as a light emitting device in an image display apparatus has been noticed.

For a constitution of the image display apparatus using the organic EL device, a constitution is usually employed in which a stacked structure of an anode layer/light emitting layer/cathode layer is basic and a transparent anode layer is formed on a substrate using a glass substrate. In this case, an emitted light is taken out on a substrate side (anode layer side).

In recent years, attempts (upper surface emission) have been made to form a transparent cathode layer and to take out the emitted light on the cathode layer side. When this upper surface emission is realized, and when not only the cathode layer but also the anode layer are formed to be transparent, it is possible to constitute a light emitting device that is entirely transparent. An arbitrary color can be used as a background color of this transparent light emitting device, and display can be colorful at a time other than an emission time, and a decorative property is improved. On the other hand, when black is used as the background color, contrast at the time of the emission is enhanced. When the upper surface emission is realized, and when a color filter or a color conversion layer is used, each layer can be disposed on the light emitting layer. Furthermore, since the emission is not blocked off by a thin film transistor (TFT) of an active driving display apparatus, the display apparatus having a high numerical aperture is possible.

As an example of the organic EL image display apparatus in which the cathode layer is formed to be transparent and accordingly the above-described upper surface emission is possible, a constitution has been disclosed in which an organic layer including an organic EL light emitting layer is disposed between the anode layer and the cathode layer, the cathode layer is constituted of an electron injection metal layer and an amorphous transparent conductive layer, and the electron injection metal layer contacts the organic layer (Japanese Patent Application Laid-Open No. 10-162959). Moreover, in order to prevent a cathode material from being diffused in the organic layer, a constitution has been disclosed in which a Ca diffusion barrier layer is disposed between the cathode layer and the organic layer, and short circuit of the organic EL device and degradation of characteristics are prevented (Japanese Patent Application Laid-Open No. 10-144957). As an example of opposite surface emission, a constitution has been disclosed in which conductive layers such as Ag, Mg, and TiN are disposed between the transparent cathode layer and the light emitting layer in order to reduce resistance of the transparent cathode layer (Japanese Patent Application Laid-Open No. 10-125469). Furthermore, a constitution has been disclosed in which TiN is used in the anode layer for a purpose of preventing penetration or diffusion of oxygen or indium into the organic layer (Japanese Patent Application Laid-Open Nos. 2002-15859, 2002-15860). In order to enhance a light emitting efficiency, the electron injection layer doped with a metal is disposed between the organic layer and the cathode layer to stabilize injection of electric charges into the organic layer (Japanese Patent Application Laid-Open Nos. 10-270171, 10-270172).

However, in the conventional organic EL image display apparatus in which the upper surface emission is possible, oxidation of the organic layer or the electron injection layer cannot be avoided by introduction of oxygen in a step of forming the transparent cathode. Therefore, there have been problems that the characteristics of the organic layer or the electron injection layer are degraded, dark spots are generated, and high-quality image display cannot be obtained.

Moreover, in the conventional organic EL image display apparatus in which the upper surface emission is possible, there have been problems that an impact by an argon ion having a high irradiance is added to the organic layer at several hundreds of volts in a step of forming the transparent cathode layer in a sputtering method, the structure of the organic layer changes, and non-radiation extinction occurs in an interface between the organic layer and the electron injection layer. There have also been problems that it is impossible to avoid the oxidation of the metal doped in the electron injection layer by the introduction of oxygen at the time of the forming of the transparent cathode layer, and therefore an electron injection function of the electron injection layer is lost.

SUMMARY OF THE INVENTION

An object of the present invention is to provide an organic electroluminescent image display apparatus in which light is taken out with high efficiency on a cathode layer side of an upper surface, and high-quality image display is possible.

To achieve the object, according to the present invention, there is provided an organic electroluminescent image display apparatus comprising: at least a substrate; and an anode, organic layer, barrier conductive layer having optical transparency, and cathode having the optical transparency successively disposed on the substrate. The barrier conductive layer is constituted to be a thin film including at least one of a metal, inorganic nitride, and inorganic oxide formed by a vacuum film forming method in which oxygen is not introduced in a film forming step.

According to another aspect of the present invention, the barrier conductive layer is constituted to have a moisture-vapor transmission rate of 1 g/m$^2$/day or less, an oxygen transmission rate of 1 cc/m$^2$/day·atm or less, a specific resistance of $1.0 \times 10^{-2}$ Ω·cm or less, and an optical transparency of 30% or more in a visible region of 380 to 780 nm.

According to another aspect of the present invention, the barrier conductive layer is a thin film formed of the metal, the metal is at least one of metals having a work function of 4.2 eV or more or an alloy of these metals, and a thickness of the barrier conductive layer is in a range of 10 to 50 nm.

According to another aspect of the present invention, the barrier conductive layer is a thin film formed of inorganic nitride, inorganic nitride is at least one of nitride of elements belonging to group 4 of a periodic table, and the thickness of the barrier conductive layer is in a range of 10 to 500 nm.

According to another aspect of the present invention, the cathode is constituted of conductive oxide, the thickness is in a range of 10 to 500 nm, and the optical transparency in the visible range of 380 to 780 nm is 60% or more.

According to another aspect of the present invention, the anode is constituted of at least one of materials included in a group consisting of at least one of metals having a work function of 4.7 eV or more, an alloy of these metals and conductive inorganic oxide.

According to another aspect of the present invention, the anode is constituted to include a structure in which a layer formed of the metal or alloy and a layer formed of the conductive inorganic oxide are stacked in order from the substrate side and to have a reflectivity.

According to another aspect of the present invention, the anode is constituted to comprise the metal or alloy and to have the reflectivity.

According to another aspect of the present invention, a sheet resistance of the cathode including the barrier conductive layer is 20 Ω/or less.

According to another aspect of the present invention, the sheet resistance of the anode is 1 Ω/or less.

According to another aspect of the present invention, the substrate is any one of a glass substrate, silicon substrate, and polymeric film.

In the present invention described above, the barrier conductive layer disposed between the organic layer and the cathode has a function of preventing the organic layer from being oxidized by introduction of oxygen at the time of forming of the cathode. Moreover, according to the present invention, the barrier conductive layer is disposed between the organic layer and the cathode, and the barrier conductive layer is constituted to be a thin film comprising at least one of the metal, inorganic nitride, and inorganic oxide formed by a vacuum film forming method in which oxygen is not introduced in a film forming step. Therefore, the organic layer is prevented from being oxidized by the introduction of oxide not only at the time of the forming of the barrier conductive layer but also at the time of the forming of the cathode having the optical transparency. Accordingly, the organic layer has high reliability without any degradation of the characteristics. The organic electroluminescent image display apparatus is obtained in which the light is taken out of the cathode on the upper surface side with high efficiency and high-quality image display is possible.

Moreover, to achieve the above-described object, according to the present invention, there is provided an organic electroluminescent image display apparatus comprising: at least a substrate; and an anode layer, organic layer, first cathode layer having optical transparency, electron transport protective layer having the optical transparency, and second cathode layer having the optical transparency successively disposed on the substrate. The electron transport protective layer contains an alkali metal and/or an alkali earth metal in a electron transporting organic material.

According to another aspect of the present invention, the first cathode layer comprises an alkali metal and/or an alkali earth metal, and the second cathode layer comprises at least one of inorganic oxide and inorganic nitride. The alkali metal and/or the alkali earth metal constituting the first cathode layer is of the same type as that of the alkali metal and/or the alkali earth metal contained in the electron transport protective layer.

According to another aspect of the present invention, the thickness of the first cathode layer is in a range of 0.1 to 10 nm, and the thickness of the electron transport protective layer is in a range of 3 to 300 nm.

According to another aspect of the present invention, the anode layer is constituted of a metal or inorganic oxide which has a specific resistance of $1.0 \times 10^{-3}$ Ω·cm or less.

According to another aspect of the present invention, a mol ratio of the electron transporting organic material and the alkali metal and/or the alkali earth metal constituting the electron transport protective layer is in a range of 1:1 to 1:3.

According to still another aspect of the present invention, the second cathode layer is formed by a vacuum film forming method in which oxygen is not introduced in a film forming step.

According to further aspect of the present invention, the second cathode layer is formed by a sputtering method using an argon gas having an oxygen content volume ratio of 1/300 or less as a sputter gas in the film forming step.

According to still further aspect of the present invention, the substrate is any one of a glass substrate, silicon substrate, and polymeric film.

In the present invention described above, the electron transport protective layer disposed between the first cathode layer and the second cathode layer has a function of preventing degradation or oxidation of the organic layer or the first cathode layer at the time of the forming of the second cathode layer. Moreover, according to the present invention, the electron transport protective layer is disposed between the first cathode layer and the second cathode layer, and the electron transport protective layer contains the alkali metal and/or the alkali earth metal in the organic material. Therefore, the degradation or the oxidation of the organic layer or the first cathode layer is prevented at the time of the forming of the second cathode layer which has the optical transparency. Accordingly, it is position to obtain an organic electroluminescent image display apparatus in which the organic layer or the first cathode layer has a high reliability without any characteristics degradation, and light can be taken out with high efficiency on the second cathode layer side of the upper surface to achieve high-quality image display.

DESCRIPTION OF THE PREFERRED EMBODIMENTS

The present invention will hereinafter be described with reference to the drawings.

Figure 1:
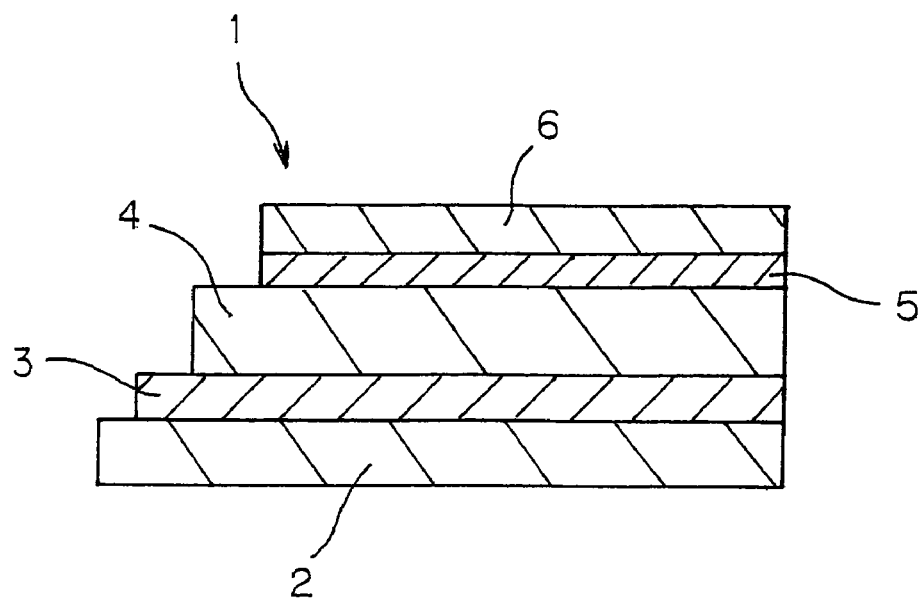
FIG. 1 is a basic constitution concept diagram showing one embodiment of an organic electroluminescent (EL) image display apparatus of the present invention.

FIG. 1 is a basic constitution concept diagram showing one embodiment of an organic electroluminescent (EL) image display apparatus of the present invention. In FIG. 1, an organic EL image display apparatus 1 includes: a substrate 2; and an anode layer 3, organic layer 4, barrier conductive layer 5 having optical transparency, and cathode layer 6 having the optical transparency successively disposed on the substrate 2. Members constituting this organic EL image display apparatus 1 will hereinafter be described.

[Substrate]

The substrate 2 constituting the organic EL image display apparatus 1 is a support body of the organic EL image display apparatus 1. In consideration of a process temperature in manufacturing steps (e.g., a polycrystalline silicon film forming step) of a thin film transistor (TFT) of an active driving display device, the substrate preferably has a heat resistance of 200° C. or more, and inorganic materials such as quartz, glass, and silicon wafer are preferably used. When amorphous silicon is used in TFT, the process temperature is relatively low. Therefore, in addition to the above-described materials, polymeric materials such as polycarbonate, polyethylene terephthalate, polybutylene terephthalate, polyphenylene sulfide, polyimide, polyamide, polyether sulfone, polyether imide, and polyether ether ketone can be used. Additionally, when the polymeric material is used, a gas barrier layer of silicon oxide or silicon nitride needs to be disposed on at least an anode layer forming surface of the substrate 2 in order to prevent the organic layer 4 from being degrading by a gas generated from the substrate.

The thickness of the substrate 2 can be set in consideration of the materials and operating conditions of the image display apparatus, and can be set, for example, to about 0.05 to 5 mm.

[Anode Layer]

The anode layer 3 constituting the organic EL image display apparatus 1 is not especially limited as long as the layer is formed of a conductive material, and can be formed of a metal or inorganic oxide having a specific resistance of $1.0 \times 10^{-3}$ Ω·cm or less. Concretely, a metal electrode layer can be formed of metals such as Au, Ta, W, Pt, Ni, Pd, and Cr, an Al alloy, a Ni alloy, a Cr alloy. When the anode layer 3 is the above-described metal electrode layer, a reflectivity of the metal electrode layer in a visible region in a range of 380 to 780 nm is set to 30% or more, preferably 50% or more. Accordingly, the light generated by the organic layer 4 is reflected by the anode layer 3, and an efficiency of taking out the light on the cathode layer side becomes higher. It is to be noted that the reflectivity indicates a value measured at room temperature in the atmosphere using an ultraviolet visible spectrophotometer (UV-2200A manufactured by Shimadzu Corp.).

Moreover, the anode layer 3 may also be a transparent electrode layer formed of: conductive inorganic oxides such as In—Sn—O (ITO), In—Zn—O (IZO), Zn—O, Zn—O—Al, Zn—Sn—O, In—O, Sn—O, Cd—O, Cd—In—O, Cd—Sn—O, Mg—In—O, Ca—Ga—O; conductive polymers such as polythiophene doped with the metal; amorphous semiconductors such as α-Si, α-SiC, and α-C; and microcrystals such as $\mu$-C—Si and $\mu$-C—O—Si.

Especially, it is preferable that the anode layer 3 be formed of at least one of materials included in a group consisting of at least one of metals having a work function of 4.7 eV or more; an alloy of these metals; and conductive inorganic oxide.

Furthermore, the anode layer 3 may also include a combined structure of a metal electrode layer and transparent electrode layer. For example, the transparent electrode layer is formed in an optically designed film thickness on the metal electrode layer. Accordingly, reflection of a light having a specific wavelength included in the lights generated in the organic layer 4 can be prevented by an optical interference effect. Accordingly, in the organic EL image display apparatus 1, the light can be taken out without using any circular polarizing plate, and a loss of light emitting efficiency can be reduced.

The thickness of the anode layer 3 depends on the material, but is in a range of 40 to 500 nm, especially preferably in a range of 100 to 300 nm. A sheet resistance of the anode layer 3 is preferably 1 Ω/or less. When the thickness of the anode layer 3 is less than 40 nm, an electric resistance sometimes increases. When the thickness exceeds 500 nm, by steps present in the ends of the anode layer 3 in which patterns are formed, a hot tear or disconnection is generated in upper layers (the organic layer 4, barrier conductive layer 5, cathode layer 6), and a short circuit is unfavorably sometimes caused between the anode layer 3 and cathode layer 6.

[Organic Layer]

The organic layer 4 constituting the organic EL image display apparatus 1 may include: a structure formed of a light emitting layer alone; a structure in which a hole injection layer or a hole injection transport layer is disposed on the side of the anode layer 3 of the light emitting layer; a structure in which an electron injection layer or an electron injection transport layer is disposed on the side of the barrier conductive layer 5 of the light emitting layer; a structure in which the hole injection layer or the hole injection transport layer is disposed on the anode 3 side of the light emitting layer and the electron injection layer or the electron injection transport layer is disposed on the side of the barrier conductive layer 5; and the like. Especially, when a conductive material including the metal, inorganic nitride, and inorganic oxide described later is used as the barrier conductive layer 5 as in the present invention, the work function increases (4.2 eV or more), an energy barrier increases in an interface between the barrier conductive layer 5 and light emitting layer, and it is difficult to directly inject electrons into the light emitting layer from the barrier conductive layer 5 under a low voltage. Therefore, the structure in which the electron injection layer or the electron injection transport layer is disposed on the barrier conductive layer 5 side is preferable. The electron injection layer or the electron injection transport layer needs to have a sufficient optical transparency in order to take out the light from the cathode layer 6 on the upper surface side with high efficiency.

It is to be noted that the hole injection transport layer or the electron injection transport layer may also include a stacked structure in which an injection function layer is disposed separately from a transport layer.

The light emitting layer constituting the organic layer 4 is assumed to have the following functions.

Injection function: a function capable of injecting holes via the anode or hole injection layer at the time of application of an electric field and capable of injecting electrons via the cathode or electron injection layer Transport function: a function of moving injected charges (electron and hole) with a force of the electric field Light emitting function: a function of providing a field of re-coupling of the electron and hole and leading to emission As the material of the light emitting layer having the functions, it has heretofore been possible to use known materials as the light emitting layer materials for the organic layer. The materials are not especially limited, and, for example, metal complex dyestuffs such as a tris(8-quinolinolate)aluminum complex (Alq3), or high-molecular weight materials such as a polydialkyl fluorene are preferably used. The thickness of the light emitting layer is not especially limited, and can be set, for example, to about 10 to 200 nm.

The hole injection transport layer is a layer formed of a hole transport compound, and has a function of transporting the holes injected via the anode into the light emitting layer. When this hole injection transport layer is disposed between the anode and the light emitting layer, many holes are injected into the light emitting layer with a lower electric field. For the hole transport compound, an arbitrary compound can be selected and used from known compounds which have heretofore been used in the hole injection transport layer of the organic EL device. Concretely, examples include bis(N-naphthyl)-N-phenyl benzidine (α-NPD), 4,4,4,-tris(3-methylphenylphenylamino)triphenyl amine (MTDATA), and the like. Moreover, as the high-molecular weight material, polyvinyl carbazole (PVCz), polyethylene dioxythiophene (PEDOT), polyphenylene vinylene derivative, and the like are preferably used. The thickness of the hole injection layer is not especially limited, and can be set, for example, to about 10 to 300 nm.

Moreover, the examples of the electron injection layer include an oxide, fluoride (e.g., LiF, NaF, $LiO_2$, $MgF_2$, $CaF_2$, $BaF_2$), and the like of the alkali metal or the alkali earth metal. Among these, especially the fluoride ($MgF_2$, $CaF_2$, $BaF_2$) of the alkali earth metal is preferably used because stability and life of the organic layer 4 are enhanced. This is because the fluoride of the alkali earth metal is low in reactivity with water and little in water absorption during or after the film forming as compared with the compound of the alkali metal or the oxide of the alkali earth metal. Furthermore, the fluoride of the alkali earth metal is high in melting point and superior in heat resistance stability as compared with the compound of the alkali metal. The thickness of the electron injection layer is preferably in a range of about 0.2 to 10 nm, because the oxide or fluoride of the alkali metal or alkali earth metal is insulative.

Moreover, as the electron injection layer, the material having a work function of 4.0 eV or less can be formed into a thin film to such a degree that the film has a sufficiently optical transparency. The examples of the material having a work function of 4.0 eV or less include Ba, Ca, Li, Cs, Mg, and the like. The thickness of the electron injection layer needs to be reduced in order to obtain a sufficiently optical transparency, and is set to 0.2 to 50 nm, preferably about 0.2 to 20 nm.

As the electron injection transport layer, an electron transporting organic material may be doped with the alkali metal or the alkali earth metal to form a metal doped layer. The examples of the electron transporting organic material include bathocuproine (BCP) and bathophenanthroline (Bphen), and the examples of the doping metal material include Li, Cs, Ba, Sr, and the like. A mol ratio of the electron transporting organic material with respect to the metal in the metal doped layer is 1:1 to 1:3, preferably about 1:1 to 1:2. Since the electron injection transport layer including the metal doped layer is large in electron mobility and high in optical transparency as compared with a single metal, the thickness of the electron injection transport layer is 5 to 1000 nm, preferably about 10 to 100 nm.

[Barrier Conductive Layer]

The barrier conductive layer 5 constituting the organic EL image display apparatus 1 is a thin film formed of at least one of the metal, inorganic nitride, and inorganic oxide formed by a vacuum film forming method in which oxygen is not introduced in a film forming step. As the above-described metal, a metal having a work function of 4.2 eV or more is preferable, and the examples thereof include Au, Ag, Al, Cu, and the like. The examples of the above-described inorganic nitride include the nitride of elements belonging to group 4 of a periodic table, such as Ti, Zr, Hf. Moreover, the examples of the inorganic oxide include the oxide of In—Sn—O, In—Zn—O, Zn—O, Zn—O—Al, Zn—Sn—O. The examples of the vacuum film forming method in which the introduction of oxygen for forming the barrier conductive layer 5 is not performed include a resistance heating vapor deposition method, electron beam vapor deposition method, sputtering method, ion plating method, CVD method, and the like.

The barrier conductive layer 5 preferably has a moisture-vapor transmission of 1 $g/m^2$/day or less, an oxygen transmission rate of 1 $cc/m^2$/day·atm or less, a specific resistance of $1.0 \times 10^{-2}$ Ω·cm or less, and an optical transparency of 30% or more in a visible region of 380 to 780 nm. Moreover, the thickness of the barrier conductive layer 5 which has the characteristics and which is a thin film formed of the metal is 10 to 50 nm, preferably about 15 to 30 nm. The thickness of the thin film formed of the inorganic nitride is 10 to 500 nm, preferably about 20 to 100 nm. The thickness of the thin film formed of the inorganic oxide is 10 to 500 nm, preferably about 20 to 200 nm.

[Cathode Layer]

The cathode layer 6 constituting the organic EL image display apparatus 1 is not especially limited as long as the layer is formed of the conductive material having transparency, and the examples of the material include conductive oxides such as In—Sn—O, In—Zn—O, Zn—O, Zn—O—Al, Zn—Sn—O. The thickness of the cathode layer 6 is preferably in a range of 10 to 500 nm, and the optical transparency in a visible region of 380 to 780 nm is preferably 60% or more. When the thickness of the cathode layer 6 is less than 10 nm, the conductivity is insufficient. When the thickness exceeds 500 nm, the optical transparency is insufficient and the organic EL image display apparatus is deformed during or after the manufacturing, defects such as cracks are unfavorably easily generated in the cathode layer 6. Furthermore, the sheet resistance of the cathode layer 6 including the barrier conductive layer 5 is preferably 20 Ω/or less.

This cathode layer 6 can be formed by the vacuum film forming methods such as the sputtering method, ion plating method, and electron beam method. When the cathode layer 6 is formed, the oxidation of the organic layer 4 by the introduction of oxygen is inhibited by the barrier conductive layer 5, and this prevents the characteristics of the organic layer 4 from being degraded.

It is to be noted that in the present invention, a color filter layer and/or a color conversion fluorescent layer is disposed on the cathode layer 6 to correct a color of each light, so that color purity may also be enhanced. For the color filter layer, for example, layers such as a blue color layer, red color layer, and green color layer may be formed using a resin composition prepared by dispersing one or a plurality of azo-based, phthalocyanine-based, and anthraquinone-based pigments in a photosensitive resin. For example, the color conversion fluorescent layer may be coated with a coat solution obtained by dispersing or dissolving a desired fluorescent dyestuff and a resin by methods such as spin coat, roll coat, and cast coat to form the film, and this film may be patterned by a photolithography method to form layers including a red conversion fluorescent layer, green conversion fluorescent layer, and blue conversion fluorescent layer.

Figure 2:
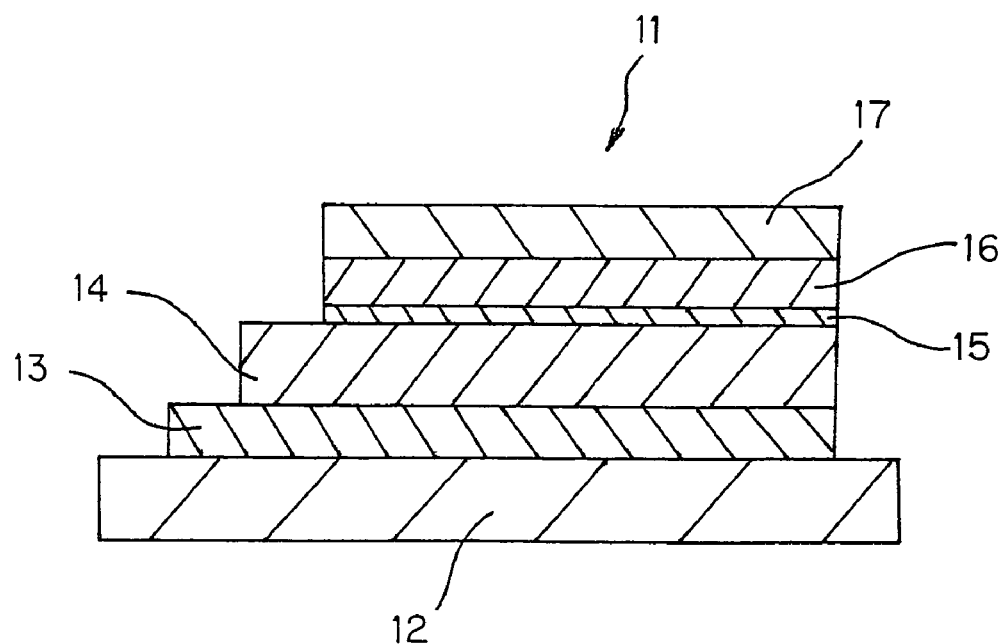
FIG. 2 is a basic constitution concept diagram showing another embodiment of the organic electroluminescent (EL) image display apparatus of the present invention.

FIG. 2 is a basic constitution concept diagram showing another embodiment of the organic electroluminescent (EL) image display apparatus of the present invention. In FIG. 2, the organic EL image display apparatus 11 includes: a substrate 12; and an anode layer 13, organic layer 14, first cathode layer 15, electron transport protective layer 16, and second cathode layer 17 successively disposed on the substrate 12. The respective members constituting this organic EL image display apparatus 11 will hereinafter be described.

Since the substrate 12 and anode layer 13 may be similar to the substrate 2 and anode layer 3 constituting the above-described organic EL image display apparatus 1, the description thereof is omitted.

[Organic Layer]

The organic layer 14 constituting the organic EL image display apparatus 11 may include a structure including the light emitting layer alone, a structure in which the hole injection layer or the hole injection transport layer is disposed on the anode layer 13 side of the light emitting layer.

(1) Light Emitting Layer

The light emitting layer constituting the organic layer 14 is assumed to have the following functions.

Injection function: the function capable of injecting the holes via the anode layer or the hole injection layer at the time of the application of the electric field and capable of injecting the electrons via the cathode layer or the electron injection layer Transport function: the function of moving the injected charges (electron and hole) with the force of the electric field Light emitting function: the function of providing the field of the re-coupling of the electron and hole and leading to the emission As the material of the light emitting layer having the functions, it has heretofore been possible to use the known materials as the light emitting layer materials for the organic layer. The materials are not especially limited, and the examples of the materials include the following dyestuff-based, metal complex-based, or polymeric material.

(Dyestuff-Based Material)

The examples of the dyestuff-based material include a cyclopendamine derivative, tetraphenyl butadiene derivative, triphenyl amine derivative, oxadiazole derivative, pyrazoloquinoline derivative, distyryl benzene derivative, distyryl arylene derivative, silole derivative, thiophene cyclized compound, pyridine cyclized compound, perynone derivative, perylene derivative, oligothiophene derivative, triphmanyl amine derivative, oxadiazole dimer, pyrazoline dimer, and the like.

(Metal Complex Based Material)

The examples of the metal complex based material include metal complexes including Al, Zn, Be, or rare earth metals such as Tb, Eu, Dy in center metals and including oxadiazole, thiadiazole, phenylpyridine, phenylbenzoimidazole, and quinoline structures in ligand, such as an alumiquinolinole complex, benzoquinolinole beryllium complex, benzoxadiazole zinc complex, benzothiazole zinc complex, azomethyl zinc complex, porphyrin zinc complex, eurobium complex, iridium metal complex, platinum metal complex.

(Polymeric Material)

The examples of the polymeric materials include a poly-para-pheylene vinylene derivative, polythiophen derivative, poly-para-phenylene derivative, polysilane derivative, polyacetylene derivative, polyfluorene derivative, polyvinyl carbazole derivative, polymerized dyestuffs or metal complex based light emitting material described above, and the like.

The examples of the method of forming the light emitting layer include: a method of forming the layer in a pattern shape by a vapor deposition method, printing method, and ink jet method; and a method of using the material for the light emitting layer as the coat solution to coat and form the layer in coat methods such as a spin coating method, casting method, dipping method, bar coat method, blade coat method, roll coat method, gravure coat method, and spray coat method. The thickness of the light emitting layer is not especially limited, and can be set, for example, to about 10 to 200 nm.

(2) Hole Injection Transport Layer

The hole injection transport layer has a function of transporting the holes injected by the anode layer 13 to the light emitting layer. When the hole injection transport layer is disposed between the anode layer 13 and the light emitting layer, many holes are injected into the light emitting layer with a lower electric field. For example, the hole injection transport layer is either one of a hole injection layer having a function of steadily injecting the holes injected from the anode layer 13 into the light emitting layer, and a hole transport layer having a function of transporting the holes injected from the anode layer 13 into the light emitting layer, or may be a layer having both the functions.

A material for developing the hole injection function is not especially limited as long as the injection of the holes into the light emitting layer from the anode layer 13 can be stabilized. Concretely, the examples of the material include organic materials forming charge moving complexes formed of: conductive polymers such as doped polyaniline, polyphenylene vinylene, polythiophene, polypyrrole, poly-para-phenylene, and polyacetylene; or electron imparting compounds such as tetramethyl phenylene diamine; and electron receiving compounds such as tetracyanoquinodimethane and tetracyanoethylene.

Moreover, the material for developing the hole transport function is not especially limited as long as the holes injected from the anode layer 13 are steadily transported to the light emitting layer. Concretely, the examples include bis(N-naphthyl)-N-phenyl benzidine ($\alpha$-NPD), 4,4,4,-tris(3-methylphenylphenylamino)triphenyl amine (MTDATA), and the like. Moreover, as the high-molecular weight material, polyvinyl carbazole (PVCz), poly-3,4-ethylene dioxythiophene (PEDOT), polyphenylene vinylene derivative, and the like are preferably used.

The thickness of the hole injection transport layer is not especially limited, and can be set, for example, to 10 to 300 nm, preferably about 30 to 100 nm.

[First Cathode Layer]

The first cathode layer 15 constituting the organic EL image display apparatus 11 may be a layer having either one of the function of steadily injecting the electrons injected by the second cathode layer 17 into the light emitting layer and the function of transporting the electrons into the light emitting layer, or a layer which has both the functions.

The material for developing the electron injection function is not especially limited as long as the injection of the electrons into the light emitting layer can be stabilized. The examples of the material include the oxide or the fluoride (e.g., LiF, NaF, $LiO_2$, $MgF_2$, $CaF_2$, $BaF_2$) of the alkali metal or the alkali earth metal. Among these, especially the fluoride ($MgF_2$, $CaF_2$, $SrF_2$, $BaF_2$) of the alkali earth metal is preferably used because the stability and life of the organic layer 4 are enhanced. This is because the fluoride of the alkali earth metal is low in reactivity with water and little in water absorption during or after the film forming as compared with the compound of the alkali metal or the oxide of the alkali earth metal. Furthermore, the fluoride of the alkali earth metal is high in melting point and superior in heat resistance stability as compared with the compound of the alkali metal. It is to be noted that the alkali metal and/or the alkali earth metal constituting the first cathode layer 15 is set to be the same as that contained in the electron transport protective layer 16 described later, accordingly continuous film forming in the same vapor source is possible, and a time of the film forming step can preferably be reduced.

Moreover, when a transparent oxide conductive material having a work function of 4.6 eV or more such as an indium oxide is used as the second cathode layer 17 described later, the material having a work function of 4.0 eV or less is preferably used to form the electron injection layer as the first cathode layer 15. That is, when the second cathode layer 17 is formed of the transparent oxide conductive material having a work function of 4.6 eV or more, the energy barrier in the interface between the second cathode layer 17 and the light emitting layer increase, and it is difficult to directly inject the electrons into the light emitting layer from the second cathode layer 17 under the low driving voltage. However, when the first cathode layer 15 positioned between these layers is constituted of the electron injection layer having a work function of 4.0 eV or less, the injection of the electrons is facilitated. The examples of the material having a work function of 4.0 eV or less include Ba, Ca, Li, Cs, Mg, and the like.

The material for developing the electron transport function is not especially limited as long as the electrons injected from the second cathode layer 17 or the electron injection layer can be transported into the light emitting layer. Concretely, the examples include bathocuproine (BCP), bathophenanthroline (Bphen), and the like.

The thickness of the first cathode layer 15 formed of the above-described materials needs to be reduced in order to obtain the sufficient optical transparency, and is set to 0.1 to 50 nm, preferably 0.1 to 20 nm, more preferably about 0.1 to 10 nm.

[Electron Transport Protective Layer]

The electron transport protective layer 16 constituting the organic EL image display apparatus 11 has both the function of a protective layer for the organic layer 14 and first cathode layer 15 and the function of the electron transport layer. The electron transport protective layer 16 is a mixture of the electron transporting organic material with the alkali metal and/or the alkali earth metal, the electron mobility is large, and the film thickness can be increased. It is therefore possible to steadily transport the electrons into the light emitting layer, and the electron transport protective layer can function as the protective layer at the time of sputtering film formation. The material of the electron transporting organic material include bathocuproine (BCP), bathophenanthroline (Bphen), and the like. The examples of the alkali metal and alkali earth metal include Li, Cs, Ba, Sr, Ca, and the like. The mol ratio of the electron transporting organic material with respect to the alkali metal or the alkali earth metal in the electron transport protective layer 16 is 1:1 to 1:3, preferably about 1:1 to 1:2. Since the electron transport protective layer 16 is large in electron mobility and high in optical transparency as compared with the single metal, the thickness of the layer is 3 to 1000 nm, preferably 3 to 300 nm, more preferably about 10 to 100 nm.

[Second Cathode Layer]

The second cathode layer 17 constituting the organic EL image display apparatus 11 is not especially limited as long as the layer is formed of the conductive material having the transparency, and the examples include conductive oxides such as In—Sn—O (ITO), In—Zn—O (IZO), Zn—O, Zn—O—Al, Zn—Sn—O. Among these, ITO, IZO are especially preferably used. Since ITO, IZO are high in conductivity and optical transparency, and low in electric resistance, the efficiency of taking out the light is enhanced, and the driving voltage of the organic layer 14 can be lowered.

The thickness of the second cathode layer 17 is in a range of 10 to 500 nm, especially preferably 50 to 300 nm, and the optical transparency in the visible region of 380 to 780 nm is 50% or more, especially preferably 80% or more. When the thickness of the second cathode layer 17 is less than 10 nm, the conductivity is insufficient. When the thickness exceeds 500 nm, the optical transparency is insufficient and the organic EL image display apparatus is deformed during or after the manufacturing, the defects such as cracks are unfavorably easily generated in the second cathode layer 17.

The second cathode layer 17 can be formed by the vacuum film forming methods such as the sputtering method, ion plating method, and electron beam method. For example, when the second cathode layer 17 is formed by the sputtering method, the presence of the electron transport protective layer 16 prevents an impact by an argon ion having a high irradiance from being added to the organic layer 14 at several hundreds of volts, and also prevents the organic layer 14 and first cathode layer 15 from being oxidized by the oxygen introduction.

It is to be noted that in the present invention, a color filter layer and/or color conversion fluorescent layer may be disposed on the second cathode layer 17 to correct each color of the light and to enhance color purity. For the color filter layer, for example, the respective layers such as the blue color layer, red color layer, and green color layer may be formed using the resin composition prepared by dispersing one or a plurality of azo-based, phthalocyanine-based, and anthraquinone-based pigments in the photosensitive resin. The color conversion fluorescent layer may be coated with the coat solution obtained by dispersing or dissolving the desired fluorescent dyestuff and the resin by the methods such as the spin coat, roll coat, and cast coat to form the film, and this film may be patterned by the photolithography method to form the layers including the red conversion fluorescent layer, green conversion fluorescent layer, and blue conversion fluorescent layer.

Next, examples of the present invention will further be described in detail, but the present invention is not limited to these examples.

EXAMPLE 1

A transparent glass substrate (nonalkali glass NA35 manufactured by NH Techno Glass K.K.) having a size of 25 mm×25 mm and a thickness of 0.7 mm was prepared as a substrate, this transparent glass substrate was cleaned in accordance with the law, and thereafter an Al thin film (thickness of 100 nm) was formed by a magnetron sputtering method. In the formation of the Al thin film, Ar was used as a sputter gas, and a pressure of 0.15 Pa, and DC output of 200 W were set. Next, to impart a function of promoting the hole injection onto the Al thin film, a thin film of indium tin oxide (ITO) (thickness of 20 nm) was formed by a magnetron sputtering method. In the formation of the ITO thin film, a mixture gas (volume ratio of $Ar:O_2=100:1$) of Ar and $O_2$ was used as the sputter gas, and a pressure of 0.1 Pa and DC output of 150 W were set.

Next, with respect to the anode layer of the Al thin film and ITO thin film, a low-resistivity meter Loresta-GP (MCP-T600) manufactured by Dia Instruments K.K., and a probe of a PSP type (electrode interval of 1.5 mm) were used to measure a surface resistivity by a four-probe method. As a result, 0.5 Ω/was obtained.

Next, the anode layer was coated with a photosensitive resist (OFPR-800 manufactured by Tokyo Ohka Kogyo Co., Ltd.) to perform mask exposing, developing (using NMD3 manufactured by Tokyo Ohka Kogyo Co., Ltd.), and etching, and two linear anodes each having a width of 2 mm were formed. It is to be noted that the patterning of this anode was possible also by dry etching.

Next, the transparent glass substrate including the anode layer was exposed to oxygen plasma. Thereafter, in the atmosphere, the transparent glass substrate was coated with Baytron P CH8000 manufactured by Bayer Ltd., which was a mixture of polyethylene dioxythiophene (PEDOT) and polystyrene sulfonate (PSS) shown by the following structural formula (1) so as to coat the anode by the spin coat method. This layer was dried to form the hole injection transport layer (thickness of 80 nm).

Structural formula (1)

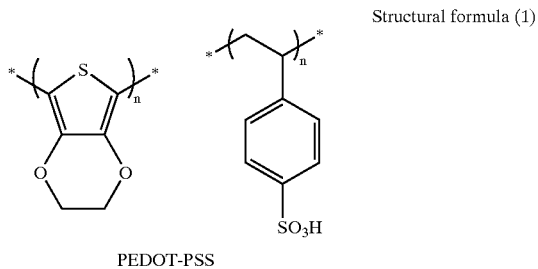

PEDOT-PSS

Next, the hole injection transport layer was coated with ADS106GE manufactured by ADS Co., Ltd., which was poly(dioctyl divinylene fluorene-co-anthracene) (PF) shown by the following structural formula (2) in a globe box having low oxygen (oxygen concentration of 1 ppm or less) and low humidity (water vapor concentration of 1 ppm or less) by the spin coat method, and was dried to form the light emitting layer (thickness of 80 nm).

Structural formula (2)

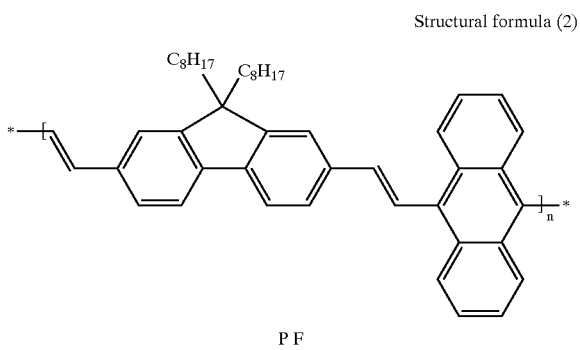

PF

Furthermore, Ca was deposited on the light emitting layer with a thickness of 5 nm to form the electron injection layer. Vapor deposition conditions were a degree of vacuum of $5 \times 10^{-5}$ Pa and a film forming rate of 1 Å/second. In the formation of the electron injection layer, the mask was used to form two linear electron injection layers each having a width of 2 mm in such a manner that the layers crossed at right angles to the anode layer.

Next, an opposite target type magnetron sputtering device was used to form a TiN thin film (thickness of 50 nm) as a barrier conductive layer. In the formation of this barrier conductive layer, the mask was used to form the linear barrier conductive layer having a width of 2 mm on the electron injection layer. In the formation of the TiN thin film, Ar, $N_2$ were used as the sputter gas, and a pressure of $2 \times 10^{-2}$ Pa, RF output of 100 W, and DC output of 150 W were set.

Next, the ITO thin film (thickness of 150 nm) was formed to constitute the cathode layer by the magnetron sputtering method. In the formation of this cathode layer, the mask was used to form the linear cathode layer having a width of 2 mm on the barrier conductive layer. In the formation of the ITO thin film, the mixture gas (volume ratio of $Ar:O_2=100:1$) of Ar and $O_2$ was used as the sputter gas, and the pressure of $5.5 \times 10^{-2}$ Pa, RF output of 100 W, DC output of 150 W, and film forming rate of 4 Å/second were set.

It is to be noted that the TiN thin film and ITO thin film were separately formed on the transparent glass substrate on the same conditions as above, Loresta-GP manufactured by Mitsubishi Chemical Corp. was used to measure the surface resistivity of the ITO thin film including the TiN thin film by the four-probe method, and as a result, 19 Ω/was obtained.

Moreover, the TiN thin film was separately formed on the transparent glass substrate on the same conditions as above, and with respect to this film, a moisture-vapor transmission, oxygen transmission rate, specific resistance, and optical transparency in a visible region of 380 to 780 nm were measured on the following conditions. As a result, the moisture-vapor transmission was 0.2 $g/m^2$/day, the oxygen transmission rate was 0.2 $cc/m^2$/day·atm, the specific resistance was $3.0 \times 10^{-4}$ Ω·cm, and a visible region average transparency was about 70%.

(Measurement of Moisture-Vapor Transmission)

A moisture-vapor transmission measuring device (PERMATRAN-W 3/31 manufactured by MOCON Co.) was used to measure the transmission on the conditions at 37.8° C. and 100% RH.

(Measurement of Oxygen Transmission Rate)

An oxygen gas transmission rate measuring device (OX-TRAN 2/20 manufactured by MOCON Co.) was used to measure the rate on the conditions at 23° C. and 90% RH.

(Measurement of Specific Resistance)

A measured surface resistivity (Ω/) was multiplied by a film thickness (cm) to calculate the specific resistance (Ω·cm). For the film thickness, Nanopics 1000 manufactured by Seiko Instruments Inc. was used to measure a film section.

(Measurement of Optical Transparency)

The ultraviolet visible spectrophotometer (UV-2200A manufactured by Shimadzu Corp.) was used to measure the transparency at room temperature in the atmosphere.

Next, an $SiO_2$ film (thickness of 5 μm) was formed as a seal film by the magnetron sputtering method. In the film formation, $SiO_x$ (x=1 to 2) was used as a target, the mixture gas (volume ratio of $Ar:O_2=200:1$) of Ar and $O_2$ was used as the sputter gas, and the pressure of 0.5 Pa, RF output of 150 W, and DC output of 200 W were set.

As described above, the organic EL image display apparatus was prepared including the anode layer patterned in a linear form with a width of 2 mm, the electron injection layer, barrier conductive layer and cathode layer formed in a linear form with a width of 2 mm so as to cross at right angles to the anode layer, and further including four light emitting areas (area of 4 $mm^2$).

A current density at the time of the application of a voltage of 6 V onto the anode and cathode layers of the organic EL image display apparatus was 280 $mA/cm^2$, and the luminance of the light emitting area measured on the upper surface (cathode layer) side was 22000 $cd/m^2$. Moreover, the light emitting area surface was observed with an optical microscope (30 times) after continuously driving the organic EL image display apparatus at 20 mA for 240 hours, but any dark spot did not exist. From this result, it has been confirmed that since the barrier conductive layer formed of the TiN thin film exists in the light emitting area, the light emitting layer and electron injection layer are prevented from being oxidized by the introduction of oxygen at the time of the formation of the cathode layer.

EXAMPLE 2

The organic EL display apparatus was prepared in the same manner as in Example 1 except that a ZrN thin film (thickness of 50 nm) was formed as the barrier conductive layer instead of the TiN thin film on the same conditions.

It is to be noted that as a result of the measurement in the same manner as in Example 1, the surface resistivity of the ITO thin film including the ZrN thin film was 20 $\Omega$/. As a result of the measurement of the moisture-vapor transmission, oxygen transmission rate, specific resistance, and optical transparency in the visible region of 380 to 780 nm of the ZrN thin film in the same manner as in Example 1, the moisture-vapor transmission was 0.3 g/m$^2$/day, the oxygen transmission rate was 0.2 cc/m$^2$/day·atm, the specific resistance was $3.4 \times 10^{-4}$ $\Omega$·cm, and the visible region average transparency was about 70%.

The current density at the time of the application of the voltage of 6 V onto the anode and cathode of the organic EL display apparatus was 260 mA/cm$^2$, and the luminance of the light emitting area measured on the upper surface (cathode layer) side was 20000 cd/m$^2$. Moreover, the light emitting area surface was observed with the optical microscope (30 times) after continuously driving the organic EL display apparatus at 20 mA for 240 hours, and any dark spot did not exist. From this result, it has been confirmed that since the barrier conductive layer formed of the ZrN thin film exists in the light emitting area, the light emitting layer and electron injection layer are prevented from being oxidized by the introduction of oxygen at the time of the formation of the cathode layer.

EXAMPLE 3

The organic EL display apparatus was prepared in the same manner as in Example 1 except that an Au thin film (thickness of 30 nm) was formed as the barrier conductive layer instead of the TiN thin film in a vacuum vapor deposition method (degree of vacuum of $5 \times 10^{-5}$ Pa, film forming rate of 0.5 A/second).

It is to be noted that as a result of the measurement in the same manner as in Example 1, the surface resistivity of the ITO thin film including the Au thin film was 15 $\Omega$/. As a result of the measurement of the moisture-vapor transmission, oxygen transmission rate, specific resistance, and optical transparency in the visible region of 380 to 780 nm of the Au thin film in the same manner as in Example 1, the moisture-vapor transmission was 0.1 g/m$^2$/day, the oxygen transmission rate was 0.1 cc/m$^2$/day·atm, the specific resistance was $1.6 \times 10^{-4}$ $\Omega$·cm, and the visible region average transparency was about 40%.

The current density at the time of the application of the voltage of 6 V onto the anode and cathode layers of the organic EL display apparatus was 330 mA/cm$^2$, and the luminance of the light emitting area measured on the upper surface (cathode layer) side was 15000 cd/m$^2$. Moreover, the light emitting area surface was observed with the optical microscope (30 times) after continuously driving the organic EL display apparatus at 20 mA for 240 hours, and any dark spot did not exist. From this result, it has been confirmed that since the barrier conductive layer formed of the Au thin film exists in the light emitting area, the light emitting layer and electron injection layer are prevented from being oxidized by the introduction of oxygen at the time of the formation of the cathode layer.

EXAMPLE 4

The organic EL display apparatus was prepared in the same manner as in Example 3 except that an Al thin film (thickness of 30 nm) was formed as the barrier conductive layer instead of the Au thin film.

It is to be noted that as a result of the measurement in the same manner as in Example 1, the surface resistivity of the ITO thin film including the Al thin film was 14 $\Omega$/. As a result of the measurement of the moisture-vapor transmission, oxygen transmission rate, specific resistance, and optical transparency in the visible region of 380 to 780 nm of the Al thin film in the same manner as in Example 1, the moisture-vapor transmission was 0.1 g/m$^2$/day, the oxygen transmission rate was 0.1 cc/m$^2$/day·atm, the specific resistance was $1.5 \times 10^{-4}$ $\Omega$·cm, and the visible region average transparency was about 40%.

The current density at the time of the application of the voltage of 6 V onto the anode and cathode layers of the organic EL display apparatus was 320 mA/cm$^2$, and the luminance of the light emitting area measured on the upper surface (cathode layer) side was 15000 cd/m$^2$. Moreover, the light emitting area surface was observed with the optical microscope (30 times) after continuously driving the organic EL display apparatus at 20 mA for 240 hours, and any dark spot did not exist. From this result, it has been confirmed that since the barrier conductive layer formed of the Al thin film exists in the light emitting area, the light emitting layer and electron injection layer are prevented from being oxidized by the introduction of oxygen at the time of the formation of the cathode layer.

EXAMPLE 5

The organic EL display apparatus was prepared in the same manner as in Example 1 except that an ITO thin film (thickness of 50 nm) which was an inorganic oxide was formed as the barrier conductive layer instead of the TiN thin film. In the formation of the ITO thin film, Ar was used as the sputter gas, and a pressure of $3 \times 10^{-2}$ Pa, RF output of 500 W, DC output of 100 W, and film forming rate of 1 A/second were set.

It is to be noted that as a result of the measurement in the same manner as in Example 1, the surface resistivity of the cathode ITO thin film including the ITO thin film which was barrier conductive layer was 20 $\Omega$/. As a result of the measurement of the moisture-vapor transmission, oxygen transmission rate, specific resistance, and optical transparency in the visible region of 380 to 780 nm of the ITO thin film in the same manner as in Example 1, the moisture-vapor transmission was 0.2 g/m$^2$/day, the oxygen transmission rate was 0.2 cc/m$^2$/day·atm, the specific resistance was $2.5 \times 10^{-4}$ $\Omega$·cm, and the visible region average transparency was about 70%.

The current density at the time of the application of the voltage of 6 V onto the anode and cathode layers of the organic EL display apparatus was 280 mA/cm$^2$, and the luminance of the light emitting area measured on the upper surface (cathode layer) side was 27000 cd/m². Moreover, the light emitting area surface was observed with the optical microscope (30 times) after continuously driving the organic EL display apparatus at 20 mA for 240 hours, and any dark spot did not exist. From this result, it has been confirmed that since the barrier conductive layer formed of the ITO thin film exists in the light emitting area, the light emitting layer and electron injection layer are prevented from being oxidized by the introduction of oxygen at the time of the formation of the cathode layer.

EXAMPLE 6

The organic EL display apparatus was prepared in the same manner as in Example 5 except that an indium zinc oxide (IZO) thin film which was similarly the inorganic oxide was formed as the barrier conductive layer instead of the ITO thin film.

It is to be noted that as a result of the measurement in the same manner as in Example 1, the surface resistivity of the ITO thin film including the IZO thin film was 20 Ω/. As a result of the measurement of the moisture-vapor transmission, oxygen transmission rate, specific resistance, and optical transparency in the visible region of 380 to 780 nm of the IZO thin film in the same manner as in Example 1, the moisture-vapor transmission was 0.2 g/m²/day, the oxygen transmission rate was 0.2 cc/m²/day·atm, the specific resistance was $2.4 \times 10^{-4}$ Ω·cm, and the visible region average transparency was about 70%.

The current density at the time of the application of the voltage of 6 V onto the anode and cathode layers of the organic EL display apparatus was 280 mA/cm², and the luminance of the light emitting area measured on the upper surface (cathode layer) side was 26000 cd/m². Moreover, the light emitting area surface was observed with the optical microscope (30 times) after continuously driving the organic EL display apparatus at 20 mA for 240 hours, and any dark spot did not exist. From this result, it has been confirmed that since the barrier conductive layer formed of the IZO thin film exists in the light emitting area, the light emitting layer and electron injection layer are prevented from being oxidized by the introduction of oxygen at the time of the formation of the cathode layer.

COMPARATIVE EXAMPLE 1

The organic EL display apparatus was prepared in the same manner as in Example 1 except that the barrier conductive layer was not formed.

The current density at the time of the application of the voltage of 6 V onto the anode and cathode layers of the organic EL display apparatus was 110 mA/cm², and the luminance of the light emitting area measured on the upper surface (cathode layer) side was 8000 cd/m². Moreover, the light emitting area surface was observed with the optical microscope (30 times) after continuously driving the organic EL display apparatus at 20 mA for 240 hours, and a dark spot having a diameter of about 0.1 mm was confirmed at a rate of several spots in a range of 1 mm². From this result, it has been confirmed that the light emitting layer and electron injection layer are oxidized by the introduction of oxygen at the time of the formation of the cathode layer in the light emitting area.

COMPARATIVE EXAMPLE 2

The organic EL display apparatus was prepared in the same manner as in Example 1 except that the ITO thin film (thickness of 50 nm) was formed instead of the barrier conductive layer formed of the TiN thin film by a sputtering method including the oxygen introduction. For the film forming conditions of the ITO thin film, the mixture gas (volume ratio of Ar:O₂=100:1) of Ar and O₂ was used as the sputter gas, and a pressure of $5.5 \times 10^{-2}$ Pa, RF output of 100 W, DC output of 150 W, and the film forming rate of 4 A/second were set.

It is to be noted that as a result of the measurement in the same manner as in Example 1, the surface resistivity of the ITO thin film was 19 Ω/. As a result of the measurement of the moisture-vapor transmission, oxygen transmission rate, specific resistance, and optical transparency in the visible region of 380 to 780 nm of the ITO thin film in the same manner as in Example 1, the moisture-vapor transmission was 0.2 g/m²/day, the oxygen transmission rate was 0.3 cc/m²/day·atm, the specific resistance was $2.1 \times 10^{-4}$ Ω·cm, and the visible region average transparency was about 80%.

The current density at the time of the application of the voltage of 6 V onto the anode and cathode layers of the organic EL display apparatus was 110 mA/cm², and the luminance of the light emitting area measured on the upper surface (cathode layer) side was 8000 cd/m². Moreover, the light emitting area surface was observed with the optical microscope (30 times) after continuously driving the organic EL display apparatus at 20 mA for 240 hours, and the dark spot having a diameter of about 0.1 mm was confirmed at a rate of several spots in a range of 1 mm². From this result, it has been confirmed that the light emitting layer and electron injection layer are oxidized at the time of the formation of the ITO thin film and cathode layer in which the oxygen introduction is performed in the light emitting area.

EXAMPLE 7

First, in the same manner as in Example 1, two linear anodes each having a width of 2 mm were formed on the transparent glass substrate.

Next, the transparent glass substrate including the anode was exposed to the oxygen plasma. Thereafter, by a vacuum heating vapor deposition method, the hole transport layer (thickness of 50 nm) formed of bis(N-naphthyl)-N-phenyl-benzidine (α-NPD) shown by the following structural formula (3) was formed on the transparent glass substrate so as to coat the anode layer. For the film forming conditions of the hole transport layer, a degree of vacuum of $5 \times 10^{-5}$ Pa, a film forming rate of 3 A/second, and a heating temperature of 350° C. were set.

Structural formula (3)

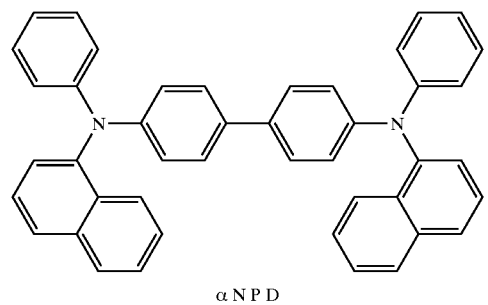

αNPD

Next, by the vacuum vapor deposition method, a tris(8-quinolinolate)aluminum complex (Alq3) shown by the following structural formula (4) was formed on the hole transport layer to form the light emitting layer (thickness of 60 nm). For the film forming conditions of the light emitting layer, a degree of vacuum of $5\times10^{-5}$ Pa, and a film forming rate of 3 A/second were set.

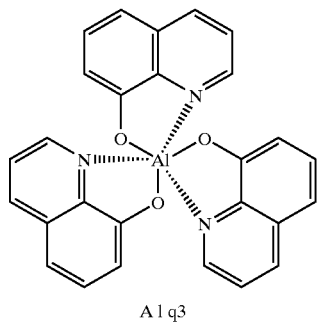

Structural formula (4)

Alq3

Furthermore, by the vacuum vapor deposition method, a co-deposited layer of bathocuproine (BCP) shown by the following structural formula (5) and Li was formed on the light emitting layer to form the electron injection layer (thickness of 20 nm). For the vapor deposition conditions, a degree of vacuum of $5\times10^{-5}$ Pa, and a film forming rate of 3 A/second by each material were set.

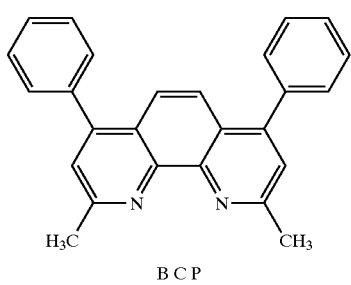

Structural formula (5)

BCP

Next, in the same manner as in Example 1, the barrier conductive layer and cathode layer were formed, and further the sealed film was formed.

As described above, the organic EL image display apparatus was prepared including the anode patterned in the linear form with a width of 2 mm, the barrier conductive layer and cathode layer formed in the linear form with a width of 2 mm so as to cross at right angles to the anode layer, and further including four light emitting areas (area of 4 $mm^2$).

The current density at the time of the application of a voltage of 6 V onto the anode and cathode layers of the organic EL image display apparatus was 3.6 $mA/cm^2$, and the luminance of the light emitting area measured on the upper surface (cathode layer) side was 200 $cd/m^2$. Moreover, the light emitting area surface was observed with the optical microscope (30 times) after continuously driving the organic EL display apparatus at 20 mA for 240 hours, but any dark spot did not exist. From this result, it has been confirmed that since the barrier conductive layer formed of the TiN thin film exists in the light emitting area, the light emitting layer and electron injection layer are prevented from being oxidized by the introduction of oxygen at the time of the formation of the cathode layer.

EXAMPLE 8

The organic EL display apparatus was prepared in the same manner as in Example 7 except that a ZrN thin film (thickness of 50 nm) was formed as the barrier conductive layer instead of the TiN thin film on the same conditions.

The current density at the time of the application of a voltage of 6 V onto the anode and cathode layers of the organic EL image display apparatus was 3.6 $mA/cm^2$, and the luminance of the light emitting area measured on the upper surface (cathode layer) side was 210 $cd/m^2$. Moreover, the light emitting area surface was observed with the optical microscope (30 times) after continuously driving the organic EL display apparatus at 20 mA for 240 hours, but any dark spot did not exist. From this result, it has been confirmed that since the barrier conductive layer formed of the ZrN thin film exists in the light emitting area, the light emitting layer and electron injection layer are prevented from being oxidized by the introduction of oxygen at the time of the formation of the cathode layer.

COMPARATIVE EXAMPLE 3

The organic EL display apparatus was prepared in the same manner as in Example 7 except that the barrier conductive layer was not formed.

The current density at the time of the application of the voltage of 6 V onto the anode and cathode layers of the organic EL display apparatus was 3.0 $mA/cm^2$, and the luminance of the light emitting area measured on the upper surface (cathode layer) side was 150 $cd/m^2$. Moreover, the light emitting area surface was observed with the optical microscope (30 times) after continuously driving the organic EL display apparatus at 20 mA for 240 hours, and the dark spot having a diameter of about 0.1 mm was confirmed at a rate of several spots in a range of 1 $mm^2$. From this result, it has been confirmed that the light emitting layer and electron injection layer are oxidized by the introduction of oxygen at the time of the formation of the cathode layer in the light emitting area.

EXAMPLE 9

First, in the same manner as in Example 1, two linear anodes each having a width of 2 mm were formed on the transparent glass substrate.

Next, in the same manner as in Example 7, the hole transport layer (thickness of 50 nm), the light emitting layer (thickness of 60 nm), and the electron injection layer (thickness of 20 nm) were formed.

Next, in the same manner as in Example 1, the barrier conductive layer and cathode layer were formed, and further the sealed film was formed. Additionally, as the barrier conductive layer, the Al thin film (thickness of 30 nm) was formed instead of the TiN thin film in the vacuum vapor deposition method (a degree of vacuum of $5\times10^{-5}$ Pa, and a film forming rate of 0.5 A/second).

As described above, the organic EL display apparatus was prepared including the anode patterned in the linear form with a width of 2 mm, the barrier conductive layer and cathode layer formed in the linear form with a width of 2 mm so as to cross at right angles to the anode layer, and further including four light emitting areas (area of 4 $mm^2$).

The current density at the time of the application of a voltage of 6 V onto the anode and cathode layers of the organic EL image display apparatus was 4.0 $mA/cm^2$, and the luminance of the light emitting area measured on the upper surface (cathode layer) side was 100 cd/m². Moreover, the light emitting area surface was observed with the optical microscope (30 times) after continuously driving the organic EL display apparatus at 20 mA for 240 hours, but any dark spot did not exist. From this result, it has been confirmed that since the barrier conductive layer formed of the TiN thin film exists in the light emitting area, the light emitting layer and electron injection layer are prevented from being oxidized by the introduction of oxygen at the time of the formation of the cathode layer.

EXAMPLE 10

A transparent glass substrate (nonalkali glass NA35 manufactured by NH Techno Glass K.K.) having a size of 25 mm×25 mm and a thickness of 0.7 mm was prepared as the substrate, this transparent glass substrate was cleaned in accordance with the law, and thereafter a Cr thin film having a thickness of 150 nm was formed by the magnetron sputtering method. In the formation of the Cr thin film, Ar was used as the sputter gas, and a pressure of 0.3 Pa, and DC output of 1.0 kW were set. Next, the Cr thin film was coated with the photosensitive resist (OFPR-800 manufactured by Tokyo Ohka Kogyo Co., Ltd.) to perform the mask exposing, the developing (using NMD3 manufactured by Tokyo Ohka Kogyo Co., Ltd.), and the etching (etching solution: MR-E2000 manufactured by The Inktech Co., Ltd.), and two linear anodes each having a width of 2 mm were formed. It is to be noted that the patterning of this anode layer may be performed by the dry etching.

Next, the transparent glass substrate was coated with Baytron P CH8000 manufactured by Bayer Ltd., which was the mixture of polyethylene dioxythiophene (PEDOT) and polystyrene sulfonate (PSS) shown by the above structural formula (1) so as to coat the anode layer by the spin coat method. This layer was dried to form the hole injection transport layer (thickness of 80 nm).

Next, the hole injection transport layer was coated with ADS106GE manufactured by ADS Co., Ltd., which was poly(dioctyl divinylene fluorene-co-anthracene) (PF) shown by the above structural formula (2) in the globe box on environmental conditions of an oxygen concentration of 0.8 ppm or less and humidity of 1 ppm or less (dew point of −115° C.) by the spin coat method, and was dried to form the light emitting layer (thickness of 80 nm).

Furthermore, a film of Ca was formed on the light emitting layer in a thickness of 3 nm in the vacuum heating vapor deposition to form the first cathode layer.

Next, a co-deposited film (thickness of 50 nm) of bathocuproine (BCP) shown by the above structural formula (5) and Li was formed on the first cathode layer to form the electron transport protective layer. For the film forming conditions of the electron transport protective layer, a degree of vacuum of $5×10^{-5}$ Pa was set, and the film forming rate of BCP was adjusted to 2 A/second so as to obtain a mol ratio of BCP to Li of 1:2.

Next, the IZO thin film (thickness of 150 nm) was formed on the electron transport protective layer by the magnetron sputtering method to form the second cathode layer. In the formation of the second cathode layer, the opposite target type magnetron sputtering device was used in order to reduce sputter damages onto the light emitting layer. For the film forming conditions of the second cathode layer, the mixture gas (volume ratio of $Ar:O_2=400:1$) of Ar and $O_2$ was used as the sputter gas, and the pressure of 0.1 Pa, RF output of 100 W, and DC output of 150 W were set. Moreover, under the conditions of a film forming rate of 4 A/second and gas pressure of $5.5×10^{-2}$ Pa, the mask was used to form the linear second cathode layer having a width 2 mm in such a manner that the layer intersected with the anode layer.

As described above, the organic EL image display apparatus was prepared including the anode layer patterned in the linear form with a width of 2 mm, and the second cathode layer formed in the linear form with a width of 2 mm so as to cross at right angles to the anode, and further including four light emitting areas (area of 4 mm²).

The current density at the time of the application of a voltage of 5 V onto the anode layer and second cathode layer of the organic EL image display apparatus was 47 mA/cm², and the luminance of the light emitting area measured on the upper surface (cathode layer) side was about 1800 cd/m². Moreover, the light emitting area surface was observed with the optical microscope (30 times) after continuously driving the organic EL image display apparatus at 20 mA for 240 hours, but any dark spot did not exist. From this result, it has been confirmed that since the electron transport protective layer exists in the light emitting area, the light emitting layer and first cathode layer are prevented from being degraded or oxidized at the time of the formation of the second cathode layer.

EXAMPLE 11

The organic EL display apparatus was prepared in the same manner as in Example 10 except that the TiN thin film was disposed as the second cathode layer instead of the IZO thin film. For the film forming conditions of the TiN thin film, only an Ar gas was used as the sputter gas, and a pressure of 0.1 Pa, RF output of 100 W, and DC output of 150 W were set. Moreover, under the conditions at a film forming rate of 4 A/second and a gas pressure of $5.5×10^{-2}$ Pa, the TiN thin film having a thickness of 150 nm was formed.

The current density at the time of the application of a voltage of 5 V onto the anode layer and second cathode layer of the organic EL image display apparatus was 42 mA/cm², and the luminance of the light emitting area measured on the upper surface (cathode layer) side was about 1700 cd/m². Moreover, the light emitting area surface was observed with the optical microscope (30 times) after continuously driving the organic EL display apparatus at 0.5 mA for 240 hours, but any dark spot did not exist. From this result, it has been confirmed that since the electron transport protective layer exists in the light emitting area, the light emitting layer and first cathode layer are prevented from being degraded or oxidized at the time of the formation of the second cathode layer.

EXAMPLE 12

The organic EL display apparatus was prepared in the same manner as in Example 10 except that the electron transport protective layer (thickness of 50 nm) of bathocuproine (BCP) containing Ca instead of Li was disposed. The film forming rate of BCP was adjusted so as to obtain a mol ratio of BCP to Ca of 1:2.

The current density at the time of the application of a voltage of 5 V onto the anode layer and second cathode layer of the organic EL image display apparatus was 50 mA/cm², and the luminance of the light emitting area measured on the upper surface (cathode layer) side was about 1800 cd/m². Moreover, the light emitting area surface was observed with the optical microscope (30 times) after continuously driving the organic EL display apparatus at 0.5 mA for 240 hours, but any dark spot did not exist. From this result, it has been confirmed that since the electron transport protective layer exists in the light emitting area, the light emitting layer and first cathode layer are prevented from being degraded or oxidized at the time of the formation of the second cathode layer.

COMPARATIVE EXAMPLE 4

The organic EL display apparatus was prepared in the same manner as in Example 12 except that the first cathode layer was not disposed.

The current density at the time of the application of the voltage of 5 V onto the anode layer and second cathode layer of the organic EL display apparatus was 6 mA/cm$^2$, and the luminance of the light emitting area measured on the upper surface (cathode layer) side was about 500 cd/m$^2$. As compared with the organic EL display apparatuses of Examples 10 to 12, light emitting characteristics were bad. Moreover, the light emitting area surface was observed with the optical microscope (30 times) after continuously driving the organic EL display apparatus at 1.0 mA for 240 hours, and the dark spot did not exist. From this result, it has been confirmed that since the electron transport protective layer exists in the light emitting area, the light emitting layer is prevented from being degraded or oxidized at the time of the formation of the second cathode layer. Moreover, it has been confirmed that since the first electrode layer formed of the alkali metal or the alkali earth metal is not disposed in the organic EL display apparatus formed of a conjugated system polymer, the light emitting characteristics drop.

COMPARATIVE EXAMPLE 5

The organic EL display apparatus was prepared in the same manner as in Example 10 except that the electron transport protective layer formed only of bathocuproine (BCP) without containing Li was disposed.

The current density at the time of the application of the voltage of 5 V onto the anode layer and second cathode layer of the organic EL display apparatus was 0.04 mA/cm$^2$, and the luminance of the light emitting area measured on the upper surface (cathode layer) side was about 0.1 cd/m$^2$. As compared with the organic EL display apparatuses of Examples 10 to 12, the light emitting characteristics were bad. Moreover, the light emitting area surface was observed with the optical microscope (30 times) after continuously driving the organic EL display apparatus at 1.0 mA for 240 hours, and the dark spot did not exist. From this result, it has been confirmed that since the electron transport protective layer exists in the light emitting area, the light emitting layer and the first cathode layer are prevented from being degraded or oxidized at the time of the formation of the second cathode layer. Moreover, it has been confirmed that since the electron transport protective layer does not contain the alkali metal or the alkali earth metal, a charge transport capability of the electron transport protective layer decrease, an electric field intensity drops, and therefore the light emitting characteristics drop.

COMPARATIVE EXAMPLE 6

The organic EL display apparatus was prepared in the same manner as in Example 10 except that the electron transport protective layer was not disposed.

The current density at the time of the application of the voltage of 5 V onto the anode layer and second cathode layer of the organic EL display apparatus was 30 mA/cm$^2$, and the luminance of the light emitting area measured on the upper surface (cathode layer) side was about 1200 cd/m$^2$. As compared with the organic EL display apparatuses of Examples 10 to 12, the light emitting characteristics dropped. Moreover, the light emitting area surface was observed with the optical microscope (30 times) after continuously driving the organic EL display apparatus at 0.5 mA for 240 hours, and the dark spot having a diameter of about 0.1 mm was confirmed at a rate of several spots in a range of 1 mm$^2$. From this result, it has been confirmed that the light emitting layer and first cathode layer are degraded or oxidized in the light emitting area at the time of the formation of the second cathode layer.

EXAMPLE 13

First the anode layer was formed in the same manner as in Example 10.

Next, bis(N-naphthyl)-N-phenylbenzidine (α-NPD) shown by the above structural formula (3) was formed into a film on the transparent glass substrate by the vacuum heating vapor deposition method so as to coat the anode layer to form the hole injection transport layer (thickness of 40 nm).

Next, the aluminum quinolinole metal complex (Alq3) shown by the above structural formula (4) was formed in a film on the hole injection transport layer by the vacuum vapor deposition method to form the light emitting layer (thickness of 60 nm).

Next, Li was formed into a film having a thickness of 3 nm on the light emitting layer by the vacuum heating vapor deposition to form the first cathode layer. Thereafter, in the same manner as in Example 10, the electron transport protective layer and second cathode layer were formed to prepare the organic EL display apparatus.

The current density at the time of the application of the voltage of 6 V onto the anode layer and second cathode layer of the organic EL display apparatus was 13 mA/cm$^2$, and the luminance of the light emitting area measured on the upper surface (cathode layer) side was about 370 cd/m$^2$. Moreover, the light emitting area surface was observed with the optical microscope (30 times) after continuously driving the organic EL display apparatus at 2.5 mA for 240 hours, and the dark spot did not exist. From this result, it has been confirmed that because of the presence of the electron transport protective layer in the light emitting area, the light emitting layer and first cathode layer are prevented from being degraded or oxidized at the time of the formation of the second cathode layer.

EXAMPLE 14

The organic EL display apparatus was prepared in the same manner as in Example 13 except that the TiN thin film was disposed as the second cathode layer instead of the IZO thin film. As the film forming conditions of the TiN thin film, only the Ar gas was used as the sputter gas, and the pressure of 0.1 Pa, RF output of 100 W, and DC output of 150 W were set. Moreover, under the conditions of a film forming rate of 4 Å/second and a gas pressure of 5.5×10$^{-2}$ Pa, the TiN thin film having a thickness of 150 nm was formed.

The current density at the time of the application of a voltage of 6 V onto the anode layer and second cathode layer of the organic EL image display apparatus was 12 mA/cm$^2$, and the luminance of the light emitting area measured on the upper surface (cathode layer) side was about 340 cd/m$^2$.

Moreover, the light emitting area surface was observed with the optical microscope (30 times) after continuously driving the organic EL display apparatus at 2.5 mA for 240 hours, but any dark spot did not exist. From this result, it has been confirmed that since the electron transport protective layer exists in the light emitting area, the light emitting layer and first cathode layer are prevented from being degraded or oxidized at the time of the formation of the second cathode layer.

COMPARATIVE EXAMPLE 7

The organic EL display apparatus was prepared in the same manner as in Example 13 except that the first cathode layer was not disposed.

The current density at the time of the application of the voltage of 6 V onto the anode layer and second cathode layer of the organic EL display apparatus was 11 mA/cm$^2$, and the luminance of the light emitting area measured on the upper surface (cathode layer) side was about 330 cd/m$^2$. As compared with the organic EL display apparatuses of Examples 13, 14, the light emitting characteristics were bad. Moreover, the light emitting area surface was observed with the optical microscope (30 times) after continuously driving the organic EL display apparatus at 2.5 mA for 240 hours, and the dark spot did not exist. From this result, it has been confirmed that by the presence of the electron transport protective layer in the light emitting layer, the light emitting layer is prevented from being degraded or oxidized at the time of the formation of the second cathode layer.

COMPARATIVE EXAMPLE 8

The organic EL display apparatus was prepared in the same manner as in Example 13 except that the electron transport protective layer was not disposed.

The current density at the time of the application of the voltage of 6 V onto the anode layer and second cathode layer of the organic EL display apparatus was 6 mA/cm$^2$, and the luminance of the light emitting area measured on the upper surface (cathode layer) side was about 180 cd/m$^2$. As compared with the organic EL display apparatuses of Examples 13, 14, the light emitting characteristics were bad. Moreover, the light emitting area surface was observed with the optical microscope (30 times) after continuously driving the organic EL display apparatus at 2.5 mA for 240 hours, and the dark spot having a diameter of about 0.1 mm was confirmed at a rate of several spots in a range of 1 mm$^2$. From this result, it has been confirmed that the light emitting layer and first cathode layer are degraded or oxidized in the light emitting area at the time of the formation of the second cathode layer.

What is claimed is:

1. An organic electroluminescent image display apparatus comprising: at least a substrate; and an anode layer, an organic layer, a first cathode layer having optical transparency, an electron transport protective layer having optical transparency, and a second cathode layer having optical transparency successively disposed on the substrate, the electron transport protective layer comprising at least one selected from the group consisting of an alkali metal and an alkali earth metal in a electron transporting organic material.

2. The organic electroluminescent image display apparatus according to claim 1, wherein the first cathode layer comprises at least one selected from the group consisting of an alkali metal and an alkali earth metal, and the second cathode layer comprises at least one selected from the group consisting of an inorganic oxide and an inorganic nitride.

3. The organic electroluminescent image display apparatus according to claim 2, wherein the at least one alkali metal and alkali earth metal comprising the first cathode layer is of the same type as that of the at least one alkali metal and alkali earth metal contained in the electron transport protective layer.

4. The organic electroluminescent image display apparatus according to claim 1, wherein a thickness of the first cathode layer is in a range of 0.1 to 10 nm, and a thickness of the electron transport protective layer is in a range of 3 to 300 nm.

5. The organic electroluminescent image display apparatus according to claim 1, wherein the anode layer comprises a metal or an inorganic oxide which has a specific resistance of $1.0 \times 10^{-3} \Omega \cdot cm$ or less.

6. The organic electroluminescent image display apparatus according to claim 1, wherein a mol ratio of the electron transporting organic material and the at least one alkali metal and alkali earth metal comprising the electron transport protective layer is in a range of 1:1 to 1:3.

7. The organic electroluminescent image display apparatus according to claim 1, wherein the second cathode layer is formed by a vacuum film forming method in which oxygen is not introduced in a film forming step.

8. The organic electroluminescent image display apparatus according to claim 1, wherein the second cathode layer is formed by a sputtering method using an argon gas having an oxygen content volume ratio of 1/300 or less as a sputter gas in a film forming step.

9. The organic electroluminescent image display apparatus according to claim 1, wherein the substrate is any one selected from the group consisting of a glass substrate a silicon substrate, and a polymeric film.

10. The organic electroluminescent image display apparatus according to claim 4, wherein a thickness of the electron transport protective layer is in a range of 10 to 100 nm.

11. The organic electroluminescent image display apparatus according to claim 1, wherein a mol ratio of the electron transporting organic material and the at least one alkali metal and alkali earth metal is in a range of 1:1 to 1:2.

12. The organic electroluminescent image display apparatus according to claim 1, wherein the electron transporting organic material is bathocuproine (BCP) or bathophenanthroline (Bphen).

* * * * *